United States Patent [19]
Aklufi

[11] Patent Number: 5,399,388
[45] Date of Patent: Mar. 21, 1995

[54] METHOD OF FORMING THIN FILMS ON SUBSTRATES AT LOW TEMPERATURES

[75] Inventor: Monti E. Aklufi, San Diego, Calif.

[73] Assignee: The United States of America as represented by the Secretary of the Navy, Washington

[21] Appl. No.: 207,312

[22] Filed: Feb. 28, 1994

[51] Int. Cl.⁶ .............................................. B05D 3/06
[52] U.S. Cl. .................... 427/575; 427/576; 427/565; 505/477; 505/737
[58] Field of Search ............... 427/575, 576, 600, 569, 427/565; 505/473, 477, 737

[56] References Cited

U.S. PATENT DOCUMENTS

| | | |
|---|---|---|
| 4,824,690 | 4/1989 | Heinecke et al. |
| 4,869,924 | 9/1989 | Ito ........................................ 427/575 |
| 4,919,077 | 4/1990 | Oda et al. |
| 4,937,094 | 6/1990 | Doehler et al. |
| 4,950,642 | 8/1990 | Okamoto et al. |
| 4,966,887 | 10/1990 | Garvey |
| 4,996,079 | 2/1991 | Itoh ....................................... 427/575 |
| 5,002,928 | 3/1991 | Fukui et al. |
| 5,015,493 | 5/1991 | Gruen |
| 5,024,182 | 6/1991 | Kobayashi et al. |
| 5,034,372 | 7/1991 | Matsuno et al. |
| 5,037,666 | 8/1991 | Mori |
| 5,093,152 | 3/1992 | Bonet et al. ........................ 427/575 |

OTHER PUBLICATIONS

Laimer et al, "Growth of diamond in a pulsed microwave discharge" Diamond Relat. Mater., 3(3), 1994 pp. 231-238.

Aklufi et al, "Synthesis of diamond films by microwave generated pulsed plasmas", Gov. Rep. Announce. Index (U.S.) 1991, 91(21) Abstr. No. 160, 228, 1991.

Primary Examiner—Roy V. King
Attorney, Agent, or Firm—Harvey Fendelman; Thomas Glenn Keough; Michael A. Kagan

[57] ABSTRACT

A method is provided for forming thin films, such as high temperature superconductors, on a surface of a substrate using pulsed microwaves to control substrate temperature. The method includes vaporizing a liquid source to form a series of vapor pulses, irradiating the vapor pulses and a makeup gas with pulsed microwaves, and exposing the surface of the substrate to the irradiated mixture to form a thin film on the surface. The microwaves may be pulsed to coincide with the arrival of the vapor pulses at the substrate, thus reducing the amount of material consumed and the amount of waste. Further, the plasma may be closely confined to the substrate with a dielectric waveguide to reduce the power required for irradiating the mixture and to prevent the formation of stray deposits on surfaces enclosing the substrate.

8 Claims, 2 Drawing Sheets

METHOD OF FORMING THIN FILMS ON SUBSTRATES AT LOW TEMPERATURES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention is directed to the art of chemical vapor deposition for forming thin films on a surface of a solid substrate. More particularly, the present invention pertains to a method for chemical vapor deposition using pulsed microwaves to dissociate and activate a vaporized solution of a precursor to form a thin film on a surface of a solid substrate at low temperature. The term low temperature means a temperature substantially reduced in comparison with substrate temperatures found in the prior art methods for chemical,vapor deposition. Thin films are formed on substrates, for example, in the manufacture of superconducting devices and integrated circuits.

Controlling substrate temperature to minimize the thermal budget while manufacturing integrated circuits is desirable, for example, to minimize reactions with reaction chamber surfaces, and to reduce the displacement of dopants to molecular lattices beyond a design range. The displacement of dopants alters the submicron dimensions of microcircuit architecture, affecting electrical characteristics of integrated circuits such as junction capacitance and switching speed. Several methods for controlling temperature in chemical vapor deposition processes for forming thin films on solid substrates are known.

U.S. Pat. No. 4,824,690 to Heinecke, et al teaches the use of pulsed radio frequency energy to form a plasma. The longer wavelengths of radio frequencies energize a volume much larger than the substrate, however, and only a fraction of the total energy is available to form the plasma which envelopes the substrate. While pulsed radio frequency energy may be used to reduce the power to the plasma, Heinecke's stated purpose is to match the dissociation rate of the plasma.

U.S. Pat. No. 4,937,094 to Doehler, et al describes the problem of heat buildup inside a chemical vapor deposition apparatus caused by generating plasma within a deposition chamber, and teaches the use of a cooling jacket to prevent contamination of a substrate from overheating. A disadvantage of this method is that the cooling jacket does not conduct heat away from the substrate itself. Furthermore, the gases surrounding the substrate act as an insulator, preventing efficient heat transfer to the cooling jacket from the substrate.

U.S. Pat. No. 5,015,493 to Gruen teaches the use of a pulsed plasma accelerated to a substrate by a DC voltage potential. A disadvantage of this method is the possibility of contamination of the substrate from materials dissociated from the DC electrode and related structures within the enclosure.

U.S. Pat. No. 5,024,182 to Kobayashi, et al teaches forming a plasma with microwaves, mixing the plasma with a reactive gas, and accelerating the mixture toward a substrate with a DC potential. A disadvantage of this method is the high substrate temperatures caused by the continuous microwave energy source. Another disadvantage of this method is the potential of contamination from the DC electrode and related structures within the enclosure.

U.S. Pat. No. 5,034,372 to Matsuno, et al describes the use of continuous microwaves to form and operate a plasma. This method also generates high substrate temperatures by use of the continuous microwave energy source, and may cause overheating of the substrate.

The disadvantages noted above of the currently known and practiced methods for forming thin films manifest the need for an improved method that provides sufficient energy to form a plasma while avoiding the high substrate temperatures that may adversely affect the performance of the devices being manufactured.

SUMMARY OF THE INVENTION

The present invention provides a method for forming a thin film on a surface of a substrate using chemical vapor deposition at low temperature, combining the steps of ultrasonically vaporizing a liquid source of a precursor to form a vapor, mixing the vapor with a makeup gas to form a mixture of gas and vapor, advantageously irradiating the mixture with pulsed microwaves, and exposing the surface of the substrate to the irradiated mixture to form a thin film on the surface.

Alternatively, the plasma may be formed by first irradiating the makeup gas with pulsed microwaves, then altering the composition of the makeup gas before forming the mixture, then exposing the mixture to the irradiated makeup gas near the surface of the substrate.

Further, the plasma may be closely confined to the substrate by a dielectric waveguide to direct the energy of the pulsed microwave radiation to a small volume around the substrate for forming a thin film on the surface of the substrate.

One advantage of the method of the present invention is to provide high peak microwave power for forming a thin film on the surface of the substrate from water based precursors, while maintaining a substrate temperature low enough to preserve the submicron architecture of the substrate that establishes the performance of the device incorporating the substrate.

Another advantage of the method of the present invention is to confine the plasma to a small volume around the substrate by closely directing the energy of the pulsed microwaves to the substrate. Confining the plasma to a small volume increases the microwave energy near the substrate for a given microwave power input, thus minimizing the electrical energy needed to generate the pulsed microwaves. Further, there is minimal irradiation of contaminants outside the plasma that might adhere to the substrate and to other surfaces within the deposition enclosure.

These and other advantages of the invention will become apparent from a consideration of the drawings and the accompanying description.

While the present invention is of particular benefit to the manufacture of superconducting devices and integrated circuits, these applications are only illustrative of the utility of the invention.

DETAILED DESCRIPTION OF THE INVENTION

Figure 1:
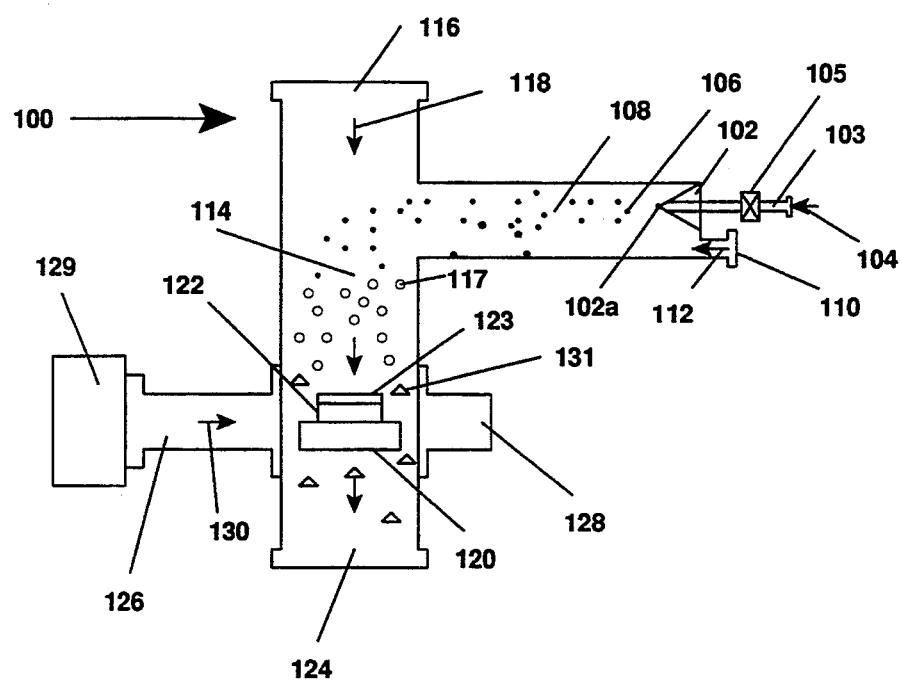
FIG. 1 illustrates a cross-sectional view of an example of an apparatus for implementing the method of the present invention for chemical vapor deposition.

In accordance with the method of the present invention, a chemical vapor deposition apparatus is illustrated in FIG. 1. A valve 105 controls the flow of a liquid source 104 introduced through a tube 103 into an ultrasonic nozzle 102 for producing vapor droplets 106. An electrically non-conductive chamber 100 controls the flow and pressure of vapor droplets 106 to a substrate 122. A waveguide 126 conducts pulsed microwaves 130 generated by pulsed microwave generator 129 into chamber 100, where they are focused by a tuning stub 128 onto substrate 122. It is believed that pulsed microwaves 130 cause the dissociation and activation of a gas and vapor mixture 117 into precursors within a plasma 131, and that the dissociated and activated precursors within plasma 131 react to form a thin film 123 on a surface of substrate 122.

Chamber 100 includes a vapor channel 108 for controlling the size of vapor droplets 106, a carrier gas port 110 for introducing a carrier gas 112 to conduct vapor droplets 106 to a deposition chamber 114, a makeup gas port 116 for introducing a makeup gas 118 to control the volume of plasma 131, a substrate support 120 for positioning substrate 122 inside deposition chamber 114, and a vacuum port 124 for maintaining a low pressure within deposition chamber 114.

Liquid source 104 may be made from a homogeneous solution of one or more compounds in accordance with well known teachings. For example, liquid source 104 may be a solution of water soluble salts, such as nitrates, in the same atomic proportion of Yttrium, Barium, and Copper found in ceramic superconductor $y^{123}$, i.e., 1:2:3. Alternatively, each precursor may be dissolved in separate solutions, then merged into a stream that combines the precursors. In this arrangement the atomic proportions may be adjusted to accommodate different rates of precursor dissociation, and other reactants may readily be added. Methods for making liquid precursors suitable for use with the present invention are described in such texts as "General College Chemistry" by Babor and Lehrman and "Physical Chemistry" by Atkins. The concentration of liquid source 104 controls the rate at which thin film 123 is formed, i.e., a more dilute solution slows the rate, while a more concentrated solution increases the rate.

Carrier gas 112 and makeup gas 118 may be, for example, different mixtures of argon and oxygen, where the proportion of oxygen may be varied in makeup gas 118 to limit the volume of plasma 131 dissociated by pulsed microwaves 130. Argon dissociates more readily than oxygen, thus a greater proportion of argon may be used for initiating plasma 131. It is believed that plasma 131 radiates ultraviolet energy that works synergistically with pulsed microwaves 130 to increase the volume of plasma 131. The proportion of argon to oxygen in makeup gas 118 may be reduced accordingly to maintain the optimum volume of plasma 131 dissociated near substrate 122 for forming thin film 123 on the surface of substrate 122. Carrier gas 112 and makeup gas 118 may also participate in the formation of thin film 123 and as such become reactants.

Ultrasonic nozzle 102 may be implemented, for example, as a Sonotek Corp. model 8711-48.

Pulsed microwaves 130 may be introduced into waveguide 126 by a pulsed microwave generator 129. By way of example, pulsed microwave generator 129 may be implemented as a combination of a Philips model PM5715 pulse generator, a Hewlett-Packard model 8341B synthesizer, a model 495A microwave amplifier, and an Energy Systems Inc. 2.5 KW, 7.36 GHz microwave power amplifier.

For operation of the method of the present invention with reference to FIG. 1, liquid source 104 is introduced into tube 103 at a flow rate controlled by valve 105. As liquid source 104 comes into contact with a horn 102a of ultrasonic nozzle 102, vibrations of ultrasonic nozzle 102 vaporize liquid source 104 into vapor droplets 106.

The size of vapor droplets 106 is controlled by the length of vapor channel 108 and the flow of carrier gas 112, i.e., the larger drops fall to the bottom of vapor channel 108. The more readily dissociated smaller drops are conducted through vapor channel 108 by carrier gas 112 into deposition chamber 114.

In deposition chamber 114, vapor droplets 106 mix with makeup gas 118 to form gas and vapor mixture 117. A vacuum drawn from vacuum port 124 causes gas and vapor mixture 117 to pass over and around substrate 122, and establishes the pressure of gas and vapor mixture 117 and makeup gas 118 inside deposition chamber 114. By way of example, the pressure inside deposition chamber 114 may be approximately 10 torr.

Substrate support 120 may be heated and continuously repositioned according to well known techniques to control the rate and uniformity of deposition of thin film 123 on substrate 122.

Pulsed microwaves 130 introduced into waveguide 126 are focused onto substrate 122 by tuning stub 128 in accordance with well known teachings. Pulsed microwaves 130 irradiate gas and vapor mixture 117 with plasma 131 near the surface of substrate 122 at a temperature limited by the duty cycle of pulsed microwaves 130. Irradiated gas and vapor mixture 117 with plasma 131 form thin film 123 on the surface of substrate 122. The composition and flow rate of makeup gas 118 control the volume of plasma 131 without altering the flow rate of vapor droplets 106, thus allowing the volume of plasma 131 to be adjusted independently of the formation rate of thin film 123 on the surface of substrate 122. The pressure of gas and vapor mixture 117 inside deposition chamber 114 controls the density of the plasma at substrate 122 to further control the formation rate of thin film 123.

Figure 3:
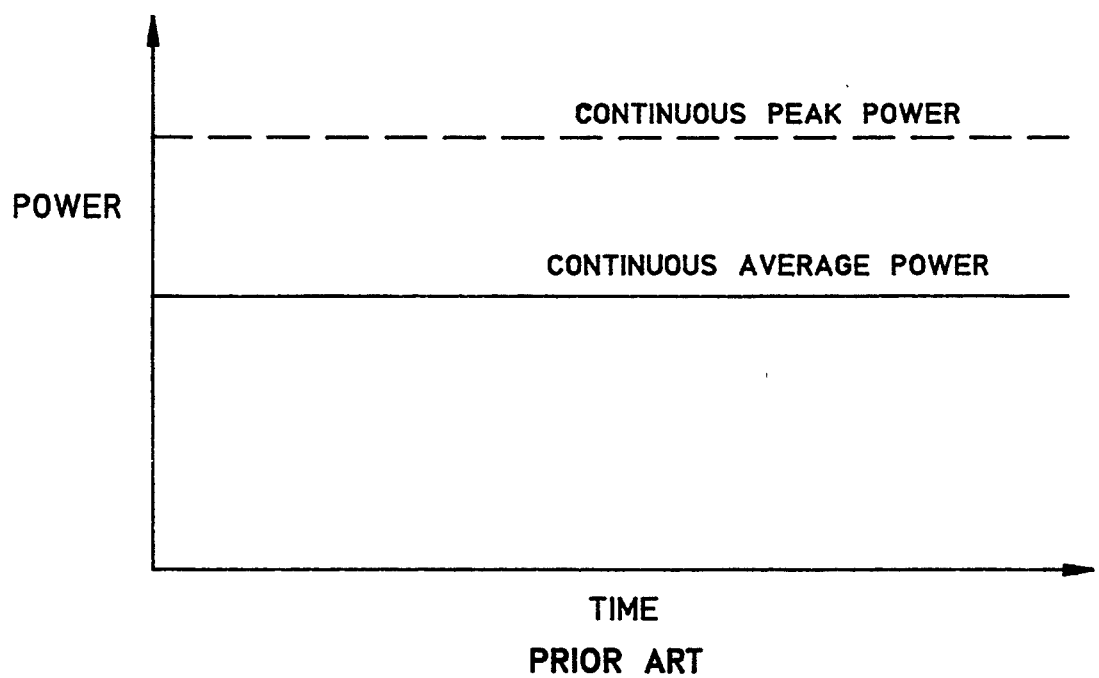
FIG. 3 is a graph of prior art use of microwave power, illustrating relative magnitudes of continuous peak power and corresponding average power.
Figure 4:
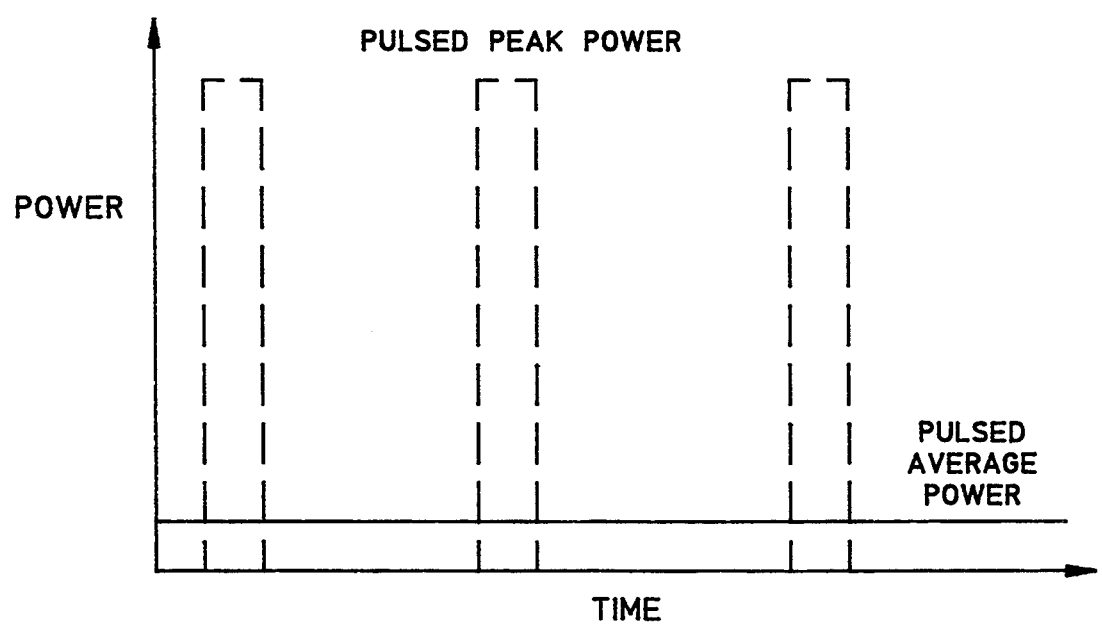
FIG. 4 is a graph of pulsed microwave power, illustrating relative magnitudes of pulsed peak power and corresponding average power.

An important advantage of the method of the present invention is using pulsed microwaves 130 to provide a sufficiently high peak power to irradiate gas and vapor mixture 117 with plasma 131, and a sufficiently low average power to maintain substrate 122 at a controlled temperature. The graph of FIG. 3 shows the relative magnitudes of peak power and average power for continuous microwaves. Continuous microwaves, used in the prior art, have an average power of approximately 70 percent of peak power. Pulsed microwaves, as taught in the method of the present invention, have an average power that may be less than 10 percent of peak power, as illustrated in the graph of FIG. 4.

The heat generated from the average microwave power establishes the temperature of substrate 122, thus the lower the average power, the lower the temperature of substrate 122. In practice, the irradiation of gas and vapor mixture 117 with plasma 131 to form thin film 123 on substrate 122 is more readily accomplished with a higher peak power from pulsed microwaves. The substrate heating caused by the higher peak power from pulsed microwaves is, however, less than the substrate heating from continuous microwaves of lesser peak power due to the lower average power of pulsed microwaves.

Alternatively, pulsed microwaves 130 may be used to irradiate makeup gas 118 to form plasma 131 near substrate 122 initially, and then the gas and vapor mixture 117 may be exposed to plasma 131. It is believed that plasma 131 radiates ultraviolet photon energy that works synergistically with pulsed microwaves 130 to further dissociate and activate gas and vapor mixture 117.

Furthermore, the flow of liquid source 104 may be controlled by valve 105 to cause liquid source 104 to be vaporized by ultrasonic nozzle 102 in a series of pulses of vapor droplets 106. Using well known synchronizing techniques, pulsed microwaves 130 may be timed to coincide substantially with the arrival of each pulse of vapor and gas mixture 117 at substrate 122. Less liquid source 104 is thus consumed to form the same thickness of thin film 123 than with continuous vaporization, and less vapor and gas mixture 117 is evacuated through vacuum port 124 as waste.

Figure 2:
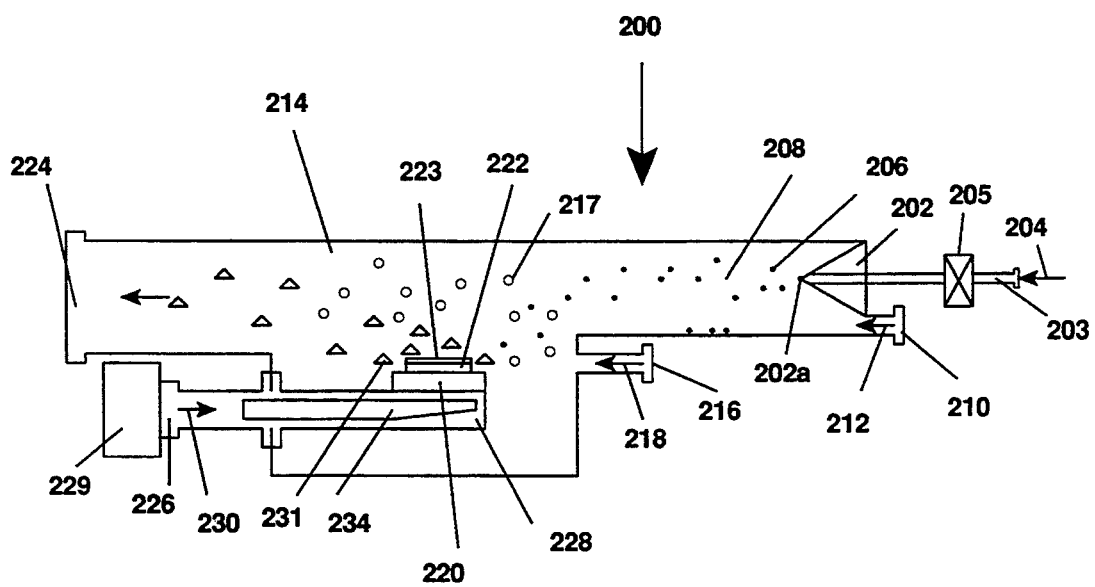
FIG. 2 illustrates a cross-sectional view of an example of an apparatus for implementing the method of the present invention for chemical vapor deposition using a dielectric waveguide.

For describing the method of the present invention using a dielectric waveguide, a chemical vapor deposition apparatus is shown in FIG. 2. A valve 205 controls the flow of a liquid source 204 introduced through a tube 203 to an ultrasonic nozzle 202 for producing vapor droplets 206. An electrically non-conductive chamber 200 controls the flow of vapor droplets 206 to a substrate 222. A waveguide 226 conducts pulsed microwaves 230 generated by a pulsed microwave generator 229 into a dielectric waveguide 234, which directs the energy of pulsed microwaves 230 to form a planar volume closely confined to a substrate 222. Pulsed microwaves 230 irradiate a gas and vapor mixture 217 and form a plasma 231 for forming a thin film 223 on a surface of a substrate 222.

Chamber 200 includes a vapor channel 208 for controlling the size of vapor droplets 206, a carrier gas port 210 for introducing a carrier gas 212 to conduct vapor droplets 206 into a deposition chamber 214, a fused silica substrate support 220 for positioning substrate 222 within deposition chamber 214, an inner chamber 228 inside deposition chamber 214 near substrate 222, a makeup gas port 216 for introducing a makeup gas 218 into deposition chamber 214 to control the volume of plasma 231, and a vacuum port 224 terminating deposition chamber 214 for maintaining a low pressure within deposition chamber 214.

Liquid source 204, carrier gas 212, makeup gas 218, ultrasonic nozzle 202, waveguide 226, and pulsed microwave generator 229 may be implemented respectively as liquid source 104, carrier gas 112, makeup gas 118, ultrasonic nozzle 102, waveguide 126, and pulsed microwave generator 129 as described above with reference to FIG. 1. Dielectric waveguide 234 may be implemented as described in U.S. Pat. No. 5,015,493, incorporated herein by reference.

Referring still to FIG. 2, liquid source 204 is introduced into tube 203 and controlled by valve 205. As liquid source 204 comes into contact with a horn 202a of ultrasonic nozzle 202, vibrations of ultrasonic nozzle 202 vaporize liquid source 204 into vapor droplets 206.

The size of vapor droplets 206 is controlled by the length of vapor channel 208 and the flow of carrier gas 212, i.e., the larger drops fall to the bottom of vapor channel 208. The more readily dissociated smaller drops are conducted by carrier gas 206 into deposition chamber 214.

In deposition chamber 214, vapor droplets 206 mix with makeup gas 218 to form gas and vapor mixture 217. A vacuum drawn through vacuum port 224 causes gas and vapor mixture 217 to pass over and around substrate 222, and establishes the pressure of gas and vapor mixture 217 and makeup gas 218 inside deposition chamber 214. By way of example, the pressure in deposition chamber 214 may be approximately 10 torr.

Pulsed microwaves 230 are introduced into waveguide 226 by pulsed microwave generator 229. Waveguide 226 terminates at inner chamber 228, and pulsed microwaves 230 are further conducted by dielectric waveguide 234 and substrate support 220 to substrate 222. For ease of positioning dielectric waveguide 234 near substrate 222, inner chamber 228 is sealed from deposition chamber 214 to permit an atmospheric pressure within inner chamber 228. Pulsed microwaves are thus directed to a planar volume closely confined to substrate 222 by dielectric waveguide 234 and by substrate support 220, irradiating gas and vapor mixture 217 with plasma 231 around substrate 222 at a substrate temperature controlled by the duty cycle of pulsed microwaves 230 to form thin film 223 on the surface of substrate 222.

The composition and flow rate of makeup gas 218 control the volume of plasma 231 without altering the flow of vapor droplets 206, thus allowing the volume of plasma 231 to be adjusted independently of the formation rate of thin film 223 on the surface of substrate 222. The pressure inside deposition chamber 214 controls the density of plasma 231, further controlling the formation rate of thin film 223.

An advantage of confining plasma 231 to a small volume around substrate 222 is that the electrical energy in pulsed microwaves 230 is fully utilized in the irradiation of gas and vapor mixture 217 in plasma 231. A further advantage of confining plasma 231 is minimizing the irradiation of gas and vapor mixture 217 near the sides of chamber 200 to avoid forming stray deposits thereon.

Alternatively, plasma 231 may initially be formed near substrate 222 by irradiating makeup gas 218 with pulsed microwaves 230. The composition of makeup gas 218 may then be altered before forming gas and vapor mixture 217. Gas and vapor mixture 217 may then be exposed to plasma 231. It is believed that plasma 231 radiates ultraviolet photon energy that works synergistically with pulsed microwaves 230 to dissociate and activate gas and vapor mixture 217.

Furthermore, valve 205 may be controlled to cause liquid source 204 to be vaporized by ultrasonic nozzle 202 in a series of pulses of vapor droplets 206. Using well known synchronizing techniques, pulsed microwaves 230 may be pulsed to coincide substantially with the arrival of each pulse of vapor in gas and vapor mixture 217 at substrate 222. Since less liquid source 204 is introduced to form thin film 223 with undiminished thickness, less vapor is evacuated through vacuum port 224 as waste.

Obviously, many modifications and variations of the present invention are possible in light of the above teachings. Within the scope of the appended claims, therefore, the invention can be practiced otherwise than as specifically described.

What is claimed is:

1. A method for forming a thin film on a surface of a substrate, comprising the steps of:
   vaporizing a liquid precursor to form a series of pulses of vapor droplets;
   mixing the series of pulses of vapor droplets with a makeup gas to form a mixture;
   irradiating the mixture with pulsed microwaves; and
   exposing the surface of the substrate to the irradiated mixture to form said thin film on the surface of the substrate.

2. The method of claim 1, wherein:
   the step of irradiating the mixture further includes confining the pulsed microwaves substantially to the substrate.

3. The method of claim 1, wherein the step of irradiating the mixture further includes pulsing the microwaves to coincide substantially with the exposure of the surface of the substrate to each pulse of vapor droplets within the mixture.

4. The method of claim 3, wherein:
   the step of irradiating the mixture further includes 5. A method for forming a thin film on a surface of a substrate, comprising the steps of:
   irradiating a first makeup gas with pulsed microwaves to form a plasma;
   vaporizing a liquid precursor to form a series of pulses of vapor droplets;
   mixing the series of pulses of vapor droplets with a second makeup gas to form a mixture;
   exposing the mixture to the plasma; and
   exposing the surface of the substrate to the mixture and the plasma to form said thin film on the surface of the substrate.

6. The method of claim 5, wherein:
   the step of irradiating a first makeup gas further includes confining the pulsed microwaves substantially to the substrate.

7. The method of claim 5, wherein the step of exposing the mixture to the plasma further includes pulsing the microwaves to coincide substantially with the exposure of the surface of the substrate to each pulse of vapor droplets within the mixture.

8. The method of claim 7, wherein:
   the step of irradiating a first makeup gas further includes confining the pulsed microwaves substantially to the substrate.

* * * * *

UNITED STATES PATENT AND TRADEMARK OFFICE
CERTIFICATE OF CORRECTION

PATENT NO.   :   5,399,388
DATED        :   21 March 1995
INVENTOR(S)  :   Monti E. Aklufi It is certified that error appears in the above—identified patent and that said Letters Patent is hereby corrected as shown below:

In column 8, line 2:  After "includes" insert --confining the pulsed microwaves and plasma substantially to the substrate. --

Signed and Sealed this

Twentieth Day of June, 1995

Attest:

BRUCE LEHMAN

Attesting Officer    Commissioner of Patents and Trademarks